(12) United States Patent
Kamiya et al.

(10) Patent No.: US 7,180,810 B2
(45) Date of Patent: *Feb. 20, 2007

(54) METHOD OF BREAKING DOWN A FUSE IN A SEMICONDUCTOR DEVICE

(75) Inventors: Takayuki Kamiya, Hamamatsu (JP); Masayoshi Omura, Hamamatsu (JP)

(73) Assignee: Yamaha Corporation (JP)

( * ) Notice: Subject to any disclaimer, the term of this patent is extended or adjusted under 35 U.S.C. 154(b) by 143 days.

This patent is subject to a terminal disclaimer.

(21) Appl. No.: 11/015,030

(22) Filed: Dec. 20, 2004

(65) Prior Publication Data

US 2005/0099860 A1    May 12, 2005

Related U.S. Application Data

(62) Division of application No. 10/935,426, filed on Sep. 8, 2004, which is a division of application No. 10/288,493, filed on Nov. 6, 2002, now Pat. No. 6,804,159.

(30) Foreign Application Priority Data

Nov. 6, 2001    (JP) .............................. 2001-340872

(51) Int. Cl.
G11C 17/18    (2006.01)
G11C 7/00    (2006.01)
(52) U.S. Cl. .................... 365/225.7; 361/111
(58) Field of Classification Search ............. 365/225.7; 361/111
See application file for complete search history.

(56) References Cited

U.S. PATENT DOCUMENTS 4,441,167 A    4/1984    Principi et al.
5,172,337 A  * 12/1992    Iwase et al. ................ 365/96
5,661,323 A    8/1997    Choi et al.
5,696,659 A  * 12/1997    Maruo ...................... 361/93.1
5,712,588 A    1/1998    Choi et al.

FOREIGN PATENT DOCUMENTS

JP    63-299139    12/1988

OTHER PUBLICATIONS

Abstract of Japanese Patent Publication No. JP 07-307389.
Abstract of Japanese Patent JP 2000040790.
Abstract of Japanese Patent JP 6021228.
European Search Report issued Mar. 27, 2006.

* cited by examiner

*Primary Examiner*—Son T. Dinh
(74) *Attorney, Agent, or Firm*—Dickstein, Shapiro, LLP.

(57) ABSTRACT

A semiconductor device has: a fuse having one end applied with a first voltage, and a MOS transistor having source, gate and drain and a connection point between the other end of the fuse and one of the source and drain, a second voltage lower than the first voltage applied to the other of the source and drain, wherein: the first and second voltages, characteristics of the MOS transistor and a resistance of the fuse are selected so that the fuse can be broken down when a predetermined program voltage is applied to the gate; and the resistance of the fuse is set to such a value as a voltage difference between a voltage at the connection point and the second voltage is lower than a drain voltage of the MOS transistor at which a drain current starts saturating, when the program voltage is applied to the gate.

6 Claims, 6 Drawing Sheets

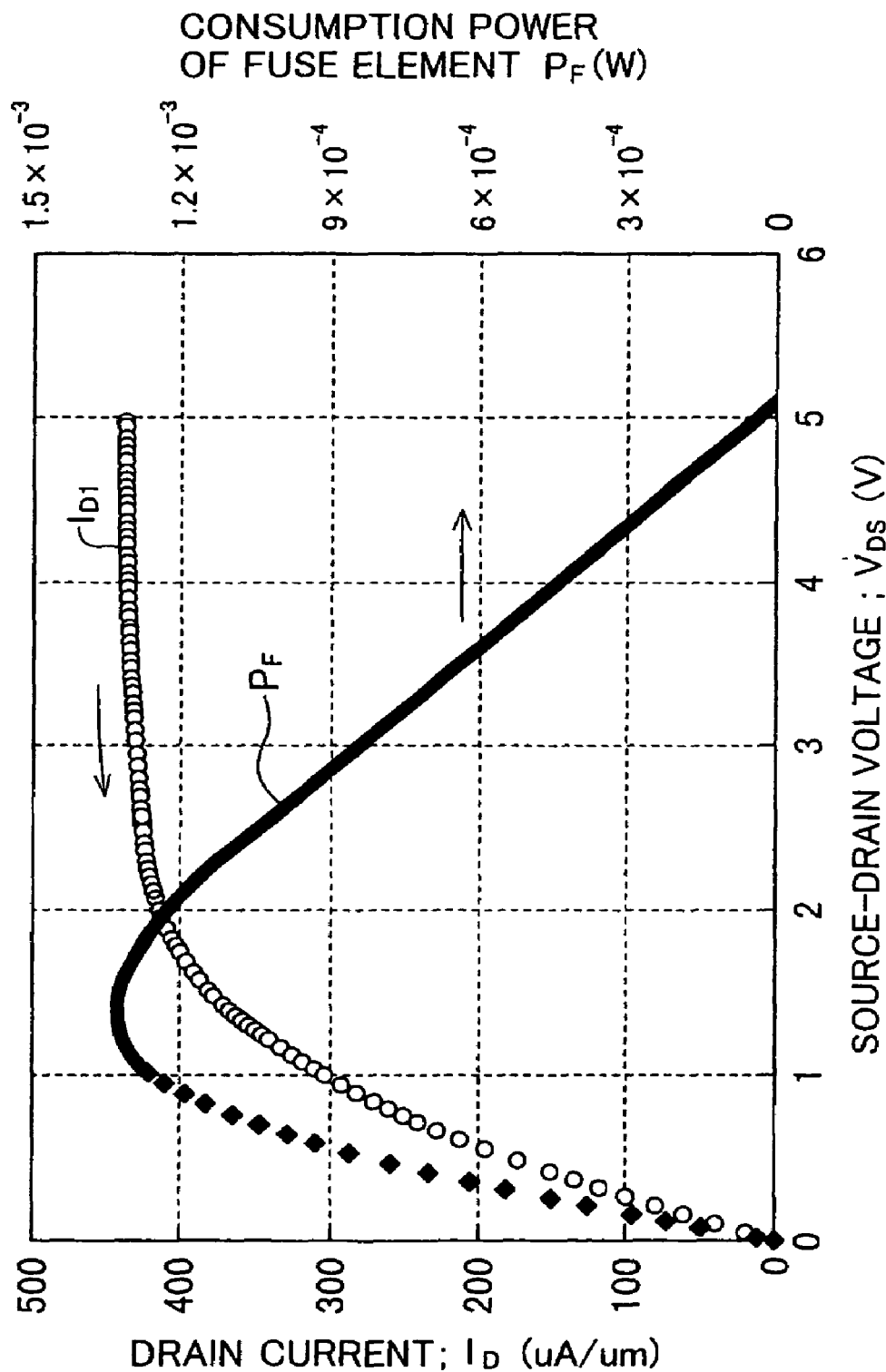

METHOD OF BREAKING DOWN A FUSE IN A SEMICONDUCTOR DEVICE

CROSS REFERENCE TO RELATED APPLICATION

This application is a Divisional of U.S. patent application Ser. No. 10/935,426 filed on Sep. 8, 2004, which is a Division of U.S. patent application Ser. No. 10/288,493 filed on Nov. 6, 2002 now U.S. Pat. No. 6,804,159.

This application is based on Japanese Patent Application No. 2001-340872, filed on Nov. 6, 2001, the entire contents of which are incorporated herein by reference.

BACKGROUND OF THE INVENTION

A) Field of the Invention

The present invention relates to a method of breaking down a fuse, and more particularly to a method of breaking down a fuse element used in a trimming circuit or a redundancy circuit, etc. in a semiconductor integrated circuit.

B) Description of the Related Art

A trimming circuit and a redundancy circuit are often formed in a semiconductor integrated circuit. If a fuse circuit having fuse elements is used as a trimming circuit or a redundancy circuit, a trimming process and the like can be performed during or after the manufacture of a semiconductor integrated circuit so that the characteristics of the circuit can be improved as much as possible.

Japanese Patent Laid-open Publication HEI-7-307389 discloses in FIG. 1 a circuit having a plurality of parallel connections of a serial connection of a fuse element and a MOS transistor. It discloses that a current drive ability necessary for obtaining a breakdown current for breaking down a fuse element is given by a function of the gate width W of a selection transistor:

$$I_D = \mu C_{ox}(W/L) \times (1/2) \times (V_{GS} - V_Y)^2$$

where $I_D$ is a drain current of a selection transistor in a saturation region, and $\mu$ is a mobility of carriers. $C_{ox}$ is a gate capacitance of the selection transistor, W is a gate width and L is a gate length. $V_{GS}$ is a gate-source voltage and $V_y$ is a threshold voltage.

If the value $I_D$ of a saturation drain current necessary for breaking down a fuse element is known, the gate width W (size) of the transistor capable of breaking down the fuse element can be estimated from the above-described equation. This analysis adopts the assumption that the saturation current of a MOS transistor is used for breaking down a fuse.

In order to melt and break down a fuse element, it is necessary to flow current through the fuse element and heat it to a temperature over the melting point thereof. For example, if single crystal silicon or polysilicon is used as the material of a fuse element, a relatively large current is required because the melting point of silicon is as high as about 1420° C. It is therefore necessary to make large the size of a selection transistor, which hinders high integration of device elements. According to the above-described Publication, a bipolar transistor having a high current drive ability is used as a selection transistor to obtain a large current.

Most of recent integrated circuits are MOS type ICs using MOS FETs as fundamental device elements. If a bipolar transistor is required to be formed in a MOS type IC, the element structure becomes complicated and additional processes are necessary.

SUMMARY OF THE INVENTION

An object of this invention is to provide a method of breaking down a fuse in a semiconductor device, which can reduce an area occupied by a fuse circuit having a fuse element and a selection transistor and fabricated in a MOS IC, by using a MOSFET as the selection transistor and reducing the area occupied by the selection transistor.

According to one aspect of the present invention, there is provided a method of breaking down a fuse in a semiconductor device, comprising the steps of:

(a) providing a semiconductor device having, on a substrate, a serial connection of a fuse element and a MOS type transistor, the fuse element being capable of being electrically broken down by flowing current therethrough, and the MOS type transistor having source, gate and drain terminals and a connection point between one end of the fuse element and one of the source and drain terminals; and (b) applying a voltage higher than a drain voltage of the MOS type transistor at which a drain current starts saturation, between the other end of the fuse element and the other of the source and drain terminals, applying a predetermined program voltage to the gate terminal, and breaking down the fuse element by setting a voltage at the connection point between the fuse element and the MOS type transistor to a voltage lower than a drain voltage of the MOS type transistor in a saturation region in which a drain current saturates.

A power supplied to the semiconductor device can be used efficiently for breaking down the fuse element.

As above, in the fuse circuit made of a serial connection of a fuse element and a selection transistor, the power supplied to the fuse circuit can be used efficiently for breaking down the fuse element. It is therefore possible to reduce the area occupied by the selection transistor.

BRIEF DESCRIPTION OF THE DRAWINGS

FIG. 3 is a graph showing a source-drain voltage dependency of a fuse consumption power.

DESCRIPTION OF THE PREFERRED EMBODIMENTS

In this embodiment, the term "fuse element" is intended to mean an element which can be broken down when a current at least equal to a predetermined value is flowed. The term "selection transistor" is intended to mean a transistor connected in series with a fuse element, determines whether current is to be flowed through the fuse element and if to be flowed, determines the amount of current.

Prior to describing the embodiment of the invention, the principle of the invention will be described with reference to FIGS. 1 to 3.

Figure 1:
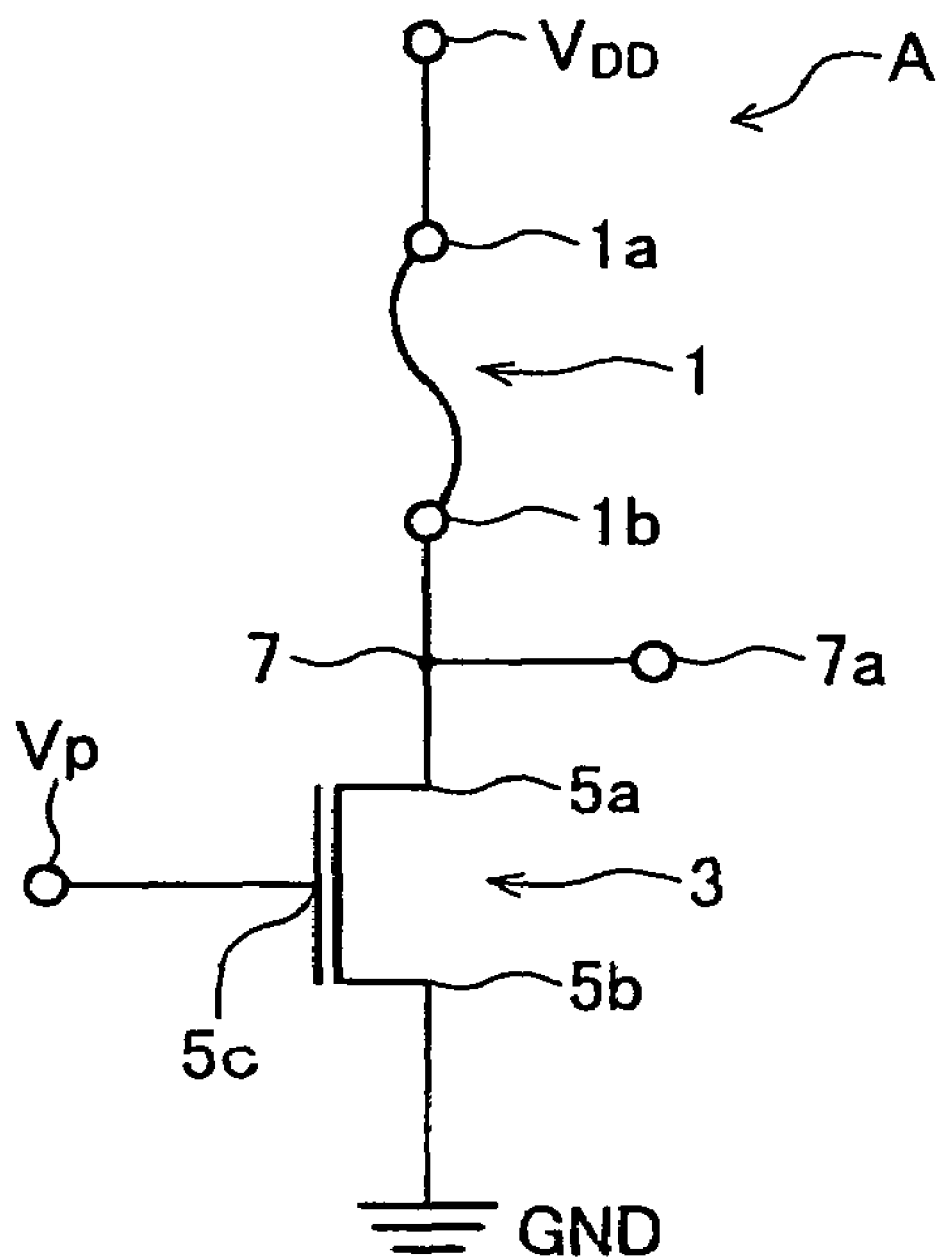
FIG. 1 is a circuit diagram of a fuse circuit having a fuse element and a MOSFET as a selection transistor for the fuse element.
Figure 2A:
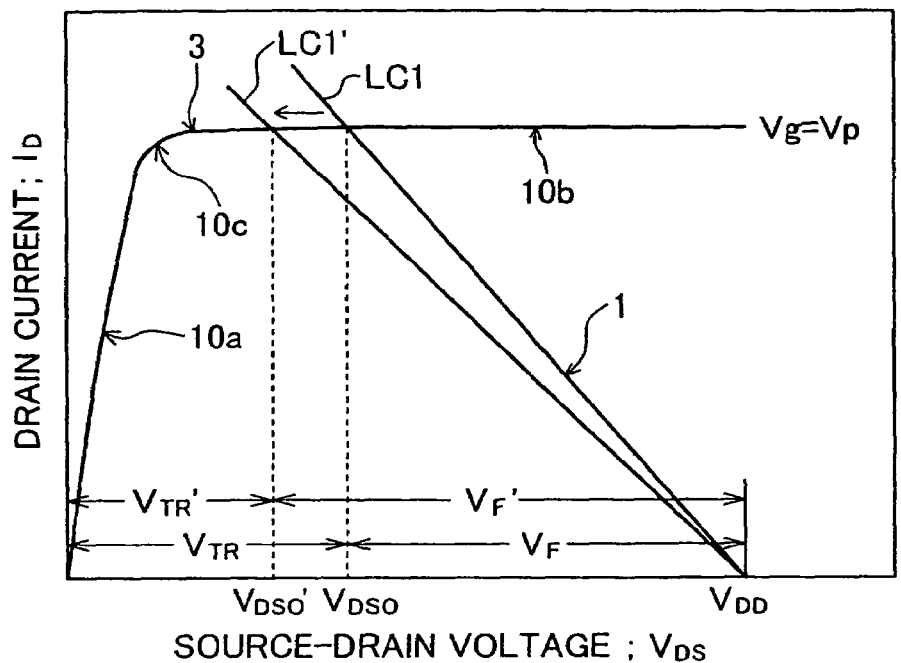
FIG. 2A is a graph showing the typical current-voltage characteristics of a MOSFET to be used as a selection transistor.
Figure 2B:
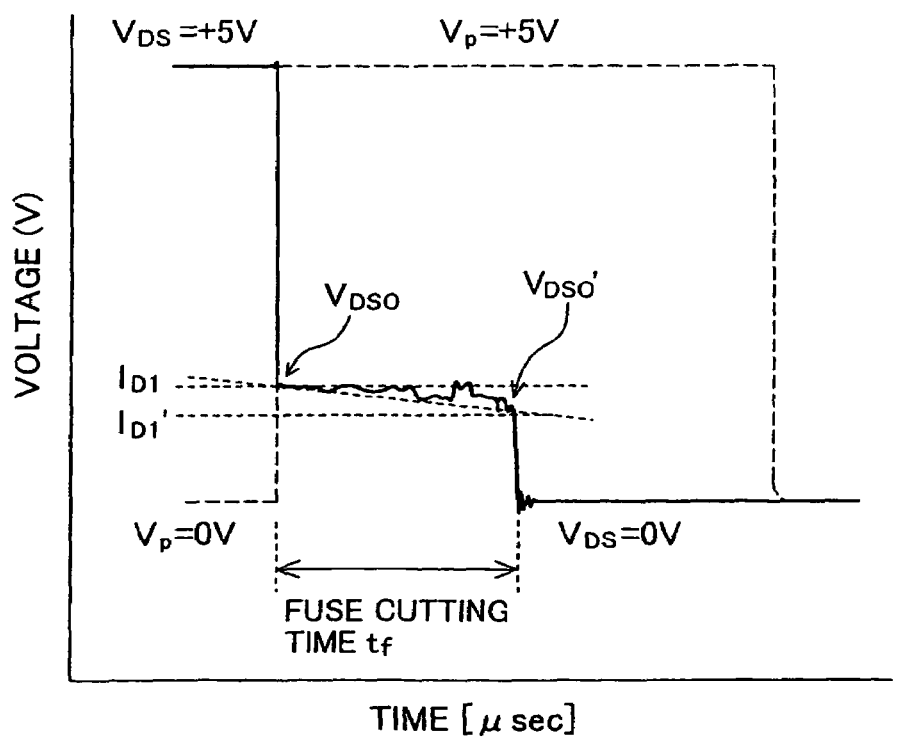
FIG. 2B is a graph showing time change of the voltage at the interconnection point between a selection transistor and a fuse.

FIG. 1 is a circuit diagram of a fuse circuit having a fuse element and an n-channel MOS type field effect transistor (MOSFET) used as a selection transistor for the fuse element. FIG. 2A is a graph showing the typical current-voltage characteristics of a MOSFET used as a selection transistor. FIG. 2B is a graph showing time change of the voltage at the interconnection point 7a between the selection transistor 3 and the fuse 1. FIG. 3 is a graph showing a power consumption of a fuse element relative to the source-drain voltage of a MOS type field effect transistor.

As shown in FIG. 1, a fuse circuit A has a fuse element 1 and a selection transistor 3 made of a MOS type FET serially connected to the fuse element.

One end 1a of the fuse element 1 is connected, for example, to a power supply voltage $V_{DD}$. The other end 1b of the fuse element is connected to the drain terminal 5a of the selection transistor 3. The source terminal 5b of the selection transistor 3 is connected to the ground (GND).

As shown in FIG. 2A, the drain current-voltage characteristics of the selection transistor 3 have a linear build-up region 10a and a saturation region 10b. In the linear region 10a, the drain voltage $V_{DS}$ is low and as the drain voltage $V_{DS}$ is raised, the drain current $I_D$ increases almost linearly. In the saturation region 10b, the drain (to source) voltage $V_{DS}$ is high and generally a constant drain current flows independently of the drain voltage $V_{DS}$. In practical cases, in the saturation region, as the drain voltage is raised, the drain current gradually increases in some case. Also in this case, the region where the drain current changes almost linearly with the drain voltage, at a rate significantly lower than that in the build-up region 10a, is called the saturation region. Between the linear region and saturation region, a region exists in which an increment of the drain current is not proportional to an increment of the drain voltage. This region is called a transition region 10c. It is practically difficult to strictly distinguish between the transition region, linear region and saturation region. It is therefore defined that one end of the transition region is a current point 20% lower than the linear characteristics of the saturation region and the other end thereof is a current point 2% lower than the linear characteristics of the saturation region.

The current-voltage characteristics of the fuse element 1 are generally the linear characteristics that current and voltage are proportional. Therefore, the voltage at a connection point (node) 7 between the fuse element 1 and selection transistor 3 corresponds to the drain voltage (voltage at the connection point 7, in this specification, it is represented by $V_{DSO}$) at a connection point (operating point) on the current-voltage characteristics between the selection transistor 3 and fuse element 1.

As shown in FIG. 2A, a voltage $V_F$ applied across the fuse element 1 is equal to $(V_{DD}-V_{DSO})$. A voltage $V_{TR}$ applied between the source and drain of the selection transistor 3 is equal to $D_{DSO}$.

A consumption power $P_T$ of the selection transistor 3 and a consumption power $P_F$ of the fuse element 1 are given by the following equations (1) and (2):

$$P_T = V_{DSO} \times I_{D1} \quad (1)$$

$$P_F = (V_{DD} - V_{DSO}) \times I_{D1} \quad (2)$$

where $I_{D1}$ is a current flowing through a serial connection of the fuse element 1 and selection transistor 3 when a predetermined program voltage $V_p$ is applied to the gate terminal 5c of the selection transistor 3.

It was found that the resistance of a polysilicon fuse may increase in the course of breaking down the fuse. In FIG. 2A, this change is shown by the shift of the load curve from LC1 to LC1'. The load curve LC1 represents the state just after the selection transistor is turned on, and the load curve LC1' represents the state just before the fuse is broken down. The source-drain voltage is decreased from $V_{DSO}$ to $V_{DSO}'$. The drain current is decreased from $I_{D1}$ to $I_{D1}'$. Then the power consumption in the fuse becomes $$P_F' = (V_{DD} - V_{DSO}') \times I_{D1}' \quad (3).$$

FIG. 2B shows an example of time change of the voltage at the interconnection between the selection transistor 3 and the fuse 1, in the circuit of FIG. 1. When the gate voltage Vp is 0 V, the selection transistor is turned off and the voltage at the interconnection terminal 7a is at the source voltage $V_{DD}$ (=5 V). When the gate voltage Vp is raised to 5 V, the selection transistor 3 is turned on to allow a current $I_{D1}$ to flow through the fuse 1. The voltage at the interconnection 7a is decreased to $V_{DSO}$ by the voltage drop across the fuse 1. At this state, the resistance of the fuse can be represented as Rf, and the voltage $V_{DSO}$ can be expressed as $$V_{DSO} = V_{DD} - (Rf \times I_{D1}) \quad (4).$$

Along with the lapse of time in which a current is allowed to flow through the fuse, the voltage at the interconnection shows generally slow decrease with minor and irregular deviations. This represents the general resistance increase of the fuse.

When a breaking or cutting current is flown through a fuse, the power consumption in the fuse will generate heat, and the temperature of the fuse will be elevated by the generated heat. Along with the temperature increase, the grains in the fuse may grow or change, and the grain boundaries may be molten. The increase of the fuse resistance may be ascribed to such phenomena.

Then, the voltage at the interconnection shows a rapid decrease to about 0 V. This represents that the resistance of the fuse becomes infinite, i.e. the fuse is broken down. The graph shows some hunting vibration after the voltage rapidly decreased to zero, which may be due to the rapid voltage change at the interconnection and not be the result of the current change through the fuse.

The point just before the rapid decrease will be called "immediately before the break-down of the fuse". At this point, the drain current is $I_{D1}'$, the voltage at the interconnection is $V_{DSO}'$, and the resistance of the fuse is Rf'. Then, $$V_{DSO}' = V_{DD} - (Rf' \times I_{D1}') \quad (5).$$

The voltage at the interconnection immediately before the break-down of the fuse is lower than the voltage just after the selection transistor is turned on, $V_{DSO}' < V_{DSO}$, which means that a higher voltage is applied across the fuse. Also, $I_{D1}' < I_{D1}$, which means that the current through the fuse is decreased, and Rf' > Rf, which means that the resistance of the fuse is increased.

In the typical MOS transistor characteristics, the power supply voltage $V_{DD}$ was set to 5 V and the program voltage $V_p$ applied to the gate terminal 5c of the selection transistor 3 was set 5 V, and the consumption power of the fuse element 1 was calculated by using the equation (2) or (3) by changing the resistance of the fuse element 1.

In this specification, the drain voltage at which the saturation region of the selection transistor starts, i.e., the voltage at which the drain current starts taking a nearly constant value (or the drain current increases approximately linearly with the drain voltage at a rate significantly lower than that in the build-up region 10a) is called a saturation voltage. More specifically, in the linear characteristics in the saturation region, a drain voltage at which the current value increases to 98% of the linear characteristics is called a saturation voltage.

FIG. 3 is a graph plotting the relation between a consumption power $P_F$ of a fuse element and a source-drain voltage. In FIG. 3, the drain current-voltage characteristics of a selection transistor are also shown. As given by the equation (2), the consumption power $P_F$ of a fuse element is a product of a voltage applied across the fuse element and a drain current flowing through the fuse element. As the resistance of a fuse element is changed, $V_{DS}$ and $I_{D1}$ change.

As shown in FIG. 3, as the source-drain voltage $V_{DS}$ of the selection transistor rises, the consumption power of the fuse element increases and takes a maximum value near at $V_{DS}=1.5$ V. The drain current is outside of the linear region and in the transition region. As the source/drain voltage $V_{DS}$ exceeds 1.5 V, an increase in the drain current becomes small, and because of a lowered voltage applied across the fuse element, the consumption power of the fuse element gradually lowers. As the drain current enters the saturation region, the fuse consumption power reduces generally linearly.

A general fuse element is set so that its operating point is in the saturation region of the selection transistor, e.g., at about 3 V. Therefore, of the power consumed by the fuse circuit, the power consumed by the selection transistor is more than about a half of the total supply power. Therefore, the ratio of the power consumed by the fuse element to break the fuse element is made small.

Based upon the above-described theoretical and experimental studies, the inventor has noticed that the operating point of the fuse circuit is better set not in the saturation region of the selection transistor but in the boundary region between the saturation region and linear region, i.e., in the transition region. By setting the operation point in the transition region, of the total consumption power of the fuse circuit, the ratio of the power consumed by the fuse element can be made large. In other words, the ratio of the power loss in the selection transistor can be made small.

Even if the load curve just after the selection transistor is turned on crosses the transition region of the source-drain I-V characteristics, if the load curve immediately before the break-down of the fuse crosses the linear build-up region of the source-drain I-V characteristics, the available power becomes small as can be seen from FIG. 3. It may results in a failure of breaking down a fuse. Thus, it is preferable that the resistance value of the fuse element and the characteristics of the selection transistor is so selected that the load curve immediately before the break-down of the fuse crosses the transition region of the source-drain I-V characteristics.

Referring to FIG. 2A, the load curve LC1' is preferably selected to cross the transition region 10c of the I-V characteristics of the selection transistor, for effectively and stably breaking down a fuse.

In connection with these studies, a semiconductor device according to an embodiment of the invention will be described with reference to FIGS. 4 and 5.

Figure 4:
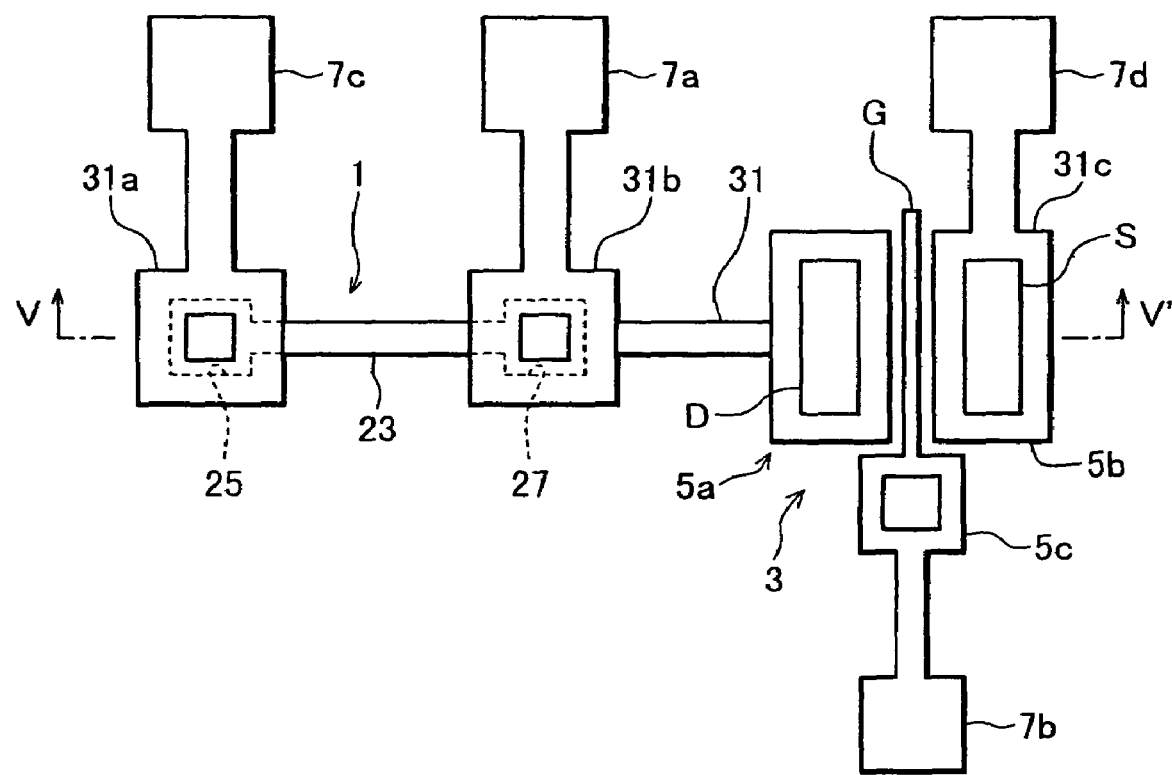
FIG. 4 is a plan view of a semiconductor device according to an embodiment of the invention.

FIG. 4 is a plan view of the semiconductor device according to the embodiment. FIG. 5 is a cross sectional view of the semiconductor device taken along line V–V' shown in FIG. 4. The semiconductor device shown in FIGS. 4 and 5 shows the specific structure of the fuse circuit shown in FIG. 1. The manufacture processes for a fuse circuit will be described.

Figure 5:
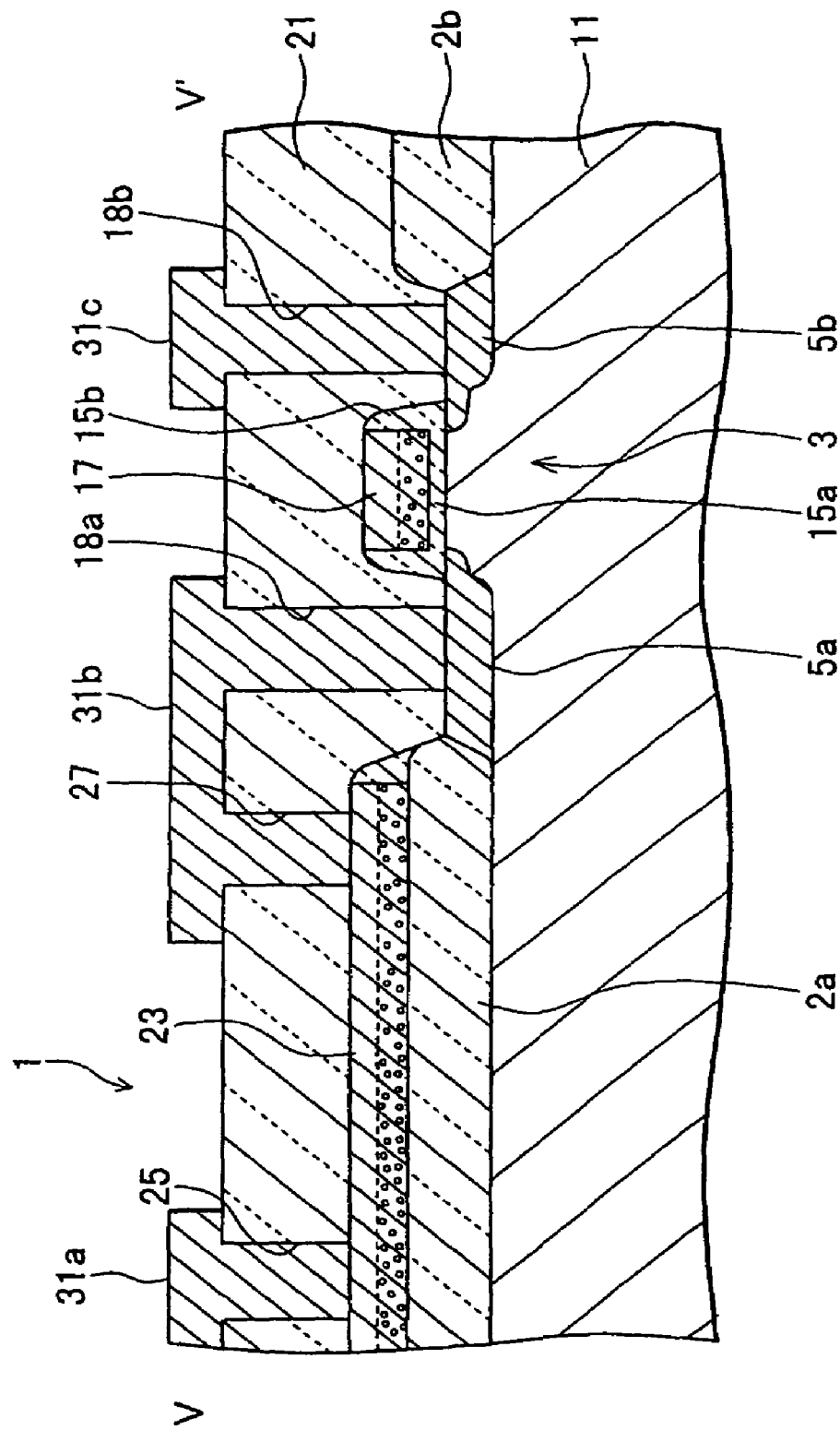
FIG. 5 is a cross sectional view of the semiconductor device taken along line V–V' shown in FIG. 4.

As shown in FIGS. 4 and 5, an isolation region 2a, 2b is formed in a predetermined area of a p-type well (impurity concentration: $10^{16}$ to $10^{17}$ cm$^{-3}$) of a semiconductor substrate 11 by local oxidation of silicon (LOCOS). The isolation region may be formed by shallow trench isolation (STI) instead of LOCOS. The isolation region 2a, 2b defines active regions where transistors are formed. Ions are implanted into the surface layer of the active region to slightly increase a p-type impurity concentration to adjust a threshold voltage.

A gate insulating film 15a of silicon oxide is formed on the surface of the active region, for example, by thermal oxidation. A gate electrode 17, for example, of polycide (lamination of silicide/polysilicon), is formed on the gate insulating film 15a. Polysilicon is doped with n-type impurities of about $10^{20}$ cm$^{-3}$. The concept of polycide is intended to include salicide. The gate electrode may be made of only polysilicon.

At the same time when the gate electrode 17 is formed, a polycide layer (or polysilicon layer) 23 used as a fuse element is formed on the isolation region 2a.

Side spacer insulating films 15b may be formed on the side walls of the gate electrode 17. In this case, the side spacers are also formed on the side walls of the fuse element 23. Prior to forming the side spacers, ion implantation for LDD (lightly doped drain) is performed to form LDD regions having an n-type impurity concentration of $10^{17}$ to $10^{18}$ cm$^{-3}$.

After the side spacers are formed, n-type impurities are implanted in the semiconductor substrate regions on both sides of the gate electrode 17 at a high impurity concentration ($10^{20}$ to $10^{21}$ cm$^{-3}$). Source/drain regions 5a/5b are therefore formed in the semiconductor substrate regions on both sides of the gate electrode, and impurities are doped also in the gate electrode 17 and fuse element 23 so that the resistances thereof are lowered.

An interlayer insulating film 21, for example, of silicon oxide, is formed over the semiconductor substrate, covering the gate electrode 17 and polycide resistance layer 23. Openings 18a and 18b are formed through the interlayer insulating film 21, reaching the source/drain regions 5a/5b on both sides of the gate electrode 17, and openings 25 and 27 are also formed reaching the upper surfaces of opposites ends of the polycide layer 23.

A first wiring layer 31a is formed which contacts the upper surface of one end of the fuse layer 23 via the opening 25. At the same time, a second wiring layer 31b is formed which contacts the upper surface of the other end of the fuse layer 23 via the opening 27 and contacts the source/drain region 5a via the opening 18a. Further, a third wiring layer 31c is formed which contacts the source/drain region 5b via the opening 18b.

As shown in FIG. 4, a read terminal 7a for reading stored data is formed which is connected to the fuse element 1 and selection transistor 3 branched from the second wiring layer 31b. Similarly, a fifth wiring layer 7b is formed which extends from the gate terminal 5c and constitutes an input terminal to which a program voltage for breaking down the fuse element 1 is applied. A terminal 7c for applying the power supply voltage $V_{DD}$ to one end of the fuse element 1 and a terminal 7d for applying a ground potential to the source/drain region 5b are also formed.

With the above processes, the fuse circuit having the fuse element 1 and the selection transistor 3 of MOSFET can be formed.

Figure 6:
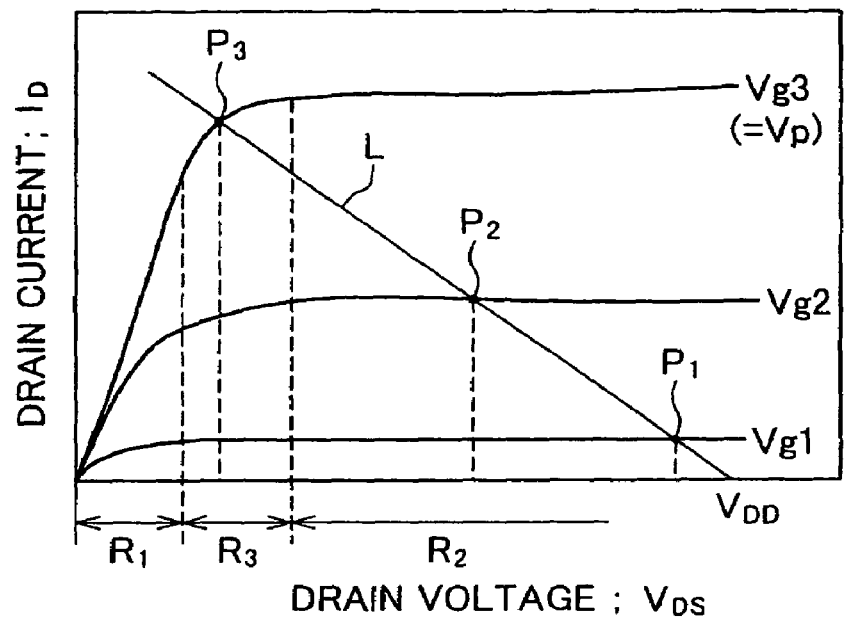
FIG. 6 is a graph showing the current-voltage characteristics of a semiconductor device of an embodiment, the graph showing a change in an operating point of a selection transistor relative to a gate voltage.
Figure 7:
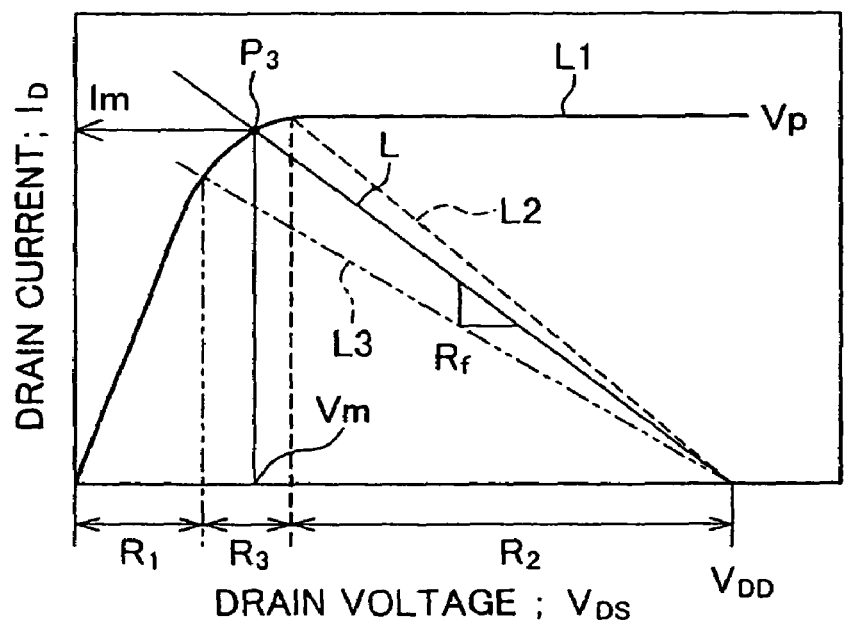
FIG. 7 is a graph showing the current-voltage characteristics of a semiconductor device of an embodiment, the graph showing the resistance of a fuse element changed to make an operating point enter in a transition region.

The characteristics of the fuse circuit will be described with reference to FIGS. 6 and 7. FIG. 6 is a graph showing the current-voltage characteristics of the fuse circuit when the gate voltage $V_g$ of the selection transistor is changed. FIG. 7 is a graph showing the current-voltage characteristics of the fuse circuit. The power supply voltage is represented by $V_{DD}$. A program voltage applied to the gate terminal of the selection transistor to break the fuse element is represented by $V_p$. A line L indicates the current-voltage characteristics of a fuse element at the fuse resistance of Rf.

As shown in FIG. 6, as the gate voltage Vg to be applied to the gate terminal of a selection transistor is raised from Vg1 to Vg2 and to Vg3, the drain current $I_D$ of the selection transistor increases. The cross point between the I-V characteristics of the selection transistor and the I-V characteristics of the fuse element also change from P1 to P2 and to P3. A difference voltage between the power supply voltage $V_{DD}$ and the drain voltage at the operating point P is a voltage applied across the fuse element. Therefore, as the gate voltage Vg is raised, the consumption power of the fuse element increases. The operating point P3 is used because a drain current sufficient for breaking down the fuse element can be obtained. The resistance value of the fuse element is selected so that the fuse element can be broken down in the state that the operating point P3 is in the transition region R3 between the linear region R1 and saturation region R2.

The operation near at the operating point P3 will be described in detail with reference to FIG. 7.

The drain current-voltage characteristics are represented by L1 in the state that a program voltage Vp is applied to the gate electrode of a selection transistor. The fuse circuit constituted of the selection transistor having the characteristics L1 and the fuse element has an operating point P3 (node between the fuse element and selection transistor) in the transition region R3 between the linear region R1 and saturation region R2. The source/drain voltage of the selection transistor at the operating point P3 is represented by Vm and the drain current at the operating point P3 is represented by Im. The drain current Im is equal to the current flowing through the fuse element. The resistance value of the fuse element is represented by Rf.

If the operating point is in the transition region R3, the power loss by the selection transistor can be made small. In order to set the operating point in the transition region, it is sufficient that the fuse has a resistance value in the range between the resistance values calculated from lines L2 and L3. The line L2 represents the current-voltage characteristics of the fuse element having such a resistance value as the operating point P3 is located at the highest voltage side in the transition region R3, and the line L3 represents the current-voltage characteristics of the fuse element having such a resistance value as the operating point P3 is located at the lowest voltage side in the transition region R3.

It is preferable to set the resistance value of the fuse element to such a value as a difference voltage between a second voltage (source voltage, in this example, ground potential) and the voltage at the node (connection point) between the fuse element and selection transistor is lower than the drain voltage at which the drain current of a MOS transistor starts saturating under the condition that a program voltage is applied to the gate terminal of the selection transistor. In this case, the ratio of invalid voltage not contributing to breaking down the fuse element can be lowered.

It is preferable to set the resistance value of the fuse element to such a value as a difference voltage between the second voltage and the voltage at the connection point between the fuse element and selection transistor is higher than the drain voltage in the linear region where the drain current of a MOS transistor is proportional to the drain voltage under the condition that a program voltage is applied to the gate terminal of the selection transistor. In this case, the drive ability of the MOS transistor can be utilized sufficiently and the size of the transistor can be made as small as necessary. The area occupied by the transistor can therefore be reduced.

The resistance value of a fuse element is preferably set to such a value that the minimum power capable of breaking down the fuse element is not smaller than 90% of the maximum consumption power of the fuse element calculated from the current-voltage characteristics of a MOS transistor. The transistor characteristics have generally a variation of 10%. It is preferable to have this margin of 10% in order that a smallest transistor can reliably flow an optimum current.

It is preferable that the resistance value of a fuse element is set so that the breakdown current of the fuse element calculated from the fuse current-voltage characteristics is in the range from 80% to 98% of the saturation current of a MOS transistor. In this case, the power sufficient for breaking down the fuse element can be retained even if there is some manufacture variation.

The drain current-voltage characteristics of the selection transistor indicated by the line L1 are the characteristics at the program voltage Vp applied to the gate terminal of the selection transistor. Generally, the program voltage is a voltage (first voltage: power supply voltage) applied to the fuse circuit in order to sufficiently turn on the selection transistor.

The program voltage may be set slightly smaller than the power supply voltage by considering a voltage drop across the transistor. On the other hand, the program voltage may be set slightly higher than the power supply voltage (first voltage) in order to make the selection transistor enter an on-state of a sufficiently low resistance. These program voltages are called "approximately equal to" the first voltage.

With the above-described settings, the consumption power of the selection transistor can be reduced and the power supplied to the fuse circuit can be used efficiently effectively to break the fuse element. The gate width of a selection transistor necessary for breaking down a fuse element can be narrowed so that the area occupied by the fuse circuit can be made small.

After a fuse element and a selection transistor are serially connected, the fuse element is broken down in accordance with any one of the following setting methods.

A first setting method will be described.

A first voltage is applied between opposite ends of a serial connection of a fuse element and a selection transistor, the first voltage being higher than a drain voltage at which a drain current of the selection transistor starts saturating. A predetermined program voltage is applied to the gate electrode of the selection transistor. The fuse element is broken down under the condition that a voltage at the connection point between the fuse element and selection transistor is higher than the drain voltage in the build-up linear region of the selection transistor and lower than the drain voltage in the saturation region.

A second setting method will be described.

A first voltage is applied between opposite ends of a serial connection of a fuse element and a selection transistor, the first voltage being higher than a drain voltage at which a drain current of the selection transistor starts saturating. A predetermined program voltage is applied to the gate electrode of the selection transistor. In this case, the program voltage is set to such a value as the consumption power of the fuse element calculated from the fuse element characteristics becomes not smaller than 90% of the maximum consumption power obtained from the calculated current-voltage characteristics of the fuse element. With these settings, the fuse element is broken down.

A third setting method will be described.

A first voltage is applied between opposite ends of a serial connection of a fuse element and a selection transistor, the first voltage being slightly higher than a drain voltage at which a drain current of the selection transistor starts saturating. A predetermined program voltage is applied to the gate electrode of the selection transistor. In this case, the program voltage is set to such a value as the voltage at the connection point between the fuse element and selection transistor falls in the voltage range allowing to flow 80% to 98% of the saturation drain current of the selection transistor. With these settings, the fuse element is broken down.

The characteristics of a selection transistor and a fuse element change with environments, particularly a temperature change. If there may be a temperature change, it is necessary to design the selection transistor and fuse element by sufficiently considering a change in the characteristics to be caused by the temperature change.

The present invention has been described in connection with the preferred embodiments. The invention is not limited only to the above embodiments. It is apparent to those skilled in the art that various modifications, improvements, combinations, and the like can be made.

What we claim are:

1. A method of breaking down a fuse in a semiconductor device, comprising the steps of:
   (a) providing a semiconductor device having, on a substrate, a serial connection of a fuse element and a MOS type transistor, the fuse element being capable of being electrically broken down by flowing current therethrough, and the MOS type transistor having source, gate and drain terminals and a connection point between one end of the fuse element and one of the source and drain terminals; and
   (b) applying a voltage higher than a drain voltage of the MOS type transistor at which a drain current starts saturation, between the other end of the fuse element and the other of the source and drain terminals, applying a predetermined program voltage to the gate terminal, and breaking down the fuse element by setting a voltage at the connection point between the fuse element and the MOS type transistor to a voltage lower than a drain voltage of the MOS type transistor in a saturation region in which a drain current saturates.

2. A method of breaking down a fuse in a semiconductor device according to claim 1 (12), wherein said setting a voltage at the connection point in said step (b) is in a state immediately before the fuse element is broken down.

3. A method of breaking down a fuse in a semiconductor device, comprising the steps of:
   (a) providing a semiconductor device having, on a substrate, a serial connection of a fuse element and a MOS type transistor, the fuse element being capable of being electrically broken down by flowing current therethrough, and the MOS type transistor having source, gate and drain terminals and a connection point between one end of the fuse element and one of the source and drain terminals; and
   (b) applying a voltage higher than a drain voltage of the MOS type transistor at which a drain current starts saturation, between the other end of the fuse element and the other of the source and drain terminals, a first voltage being applied to the other end of the fuse element, and a second voltage lower than the first voltage being applied to the other of the source and drain terminals, applying a predetermined program voltage to the gate terminal, and breaking down the fuse element by setting a voltage at the connection point of the MOS type transistor in a voltage range in which a consumption power of the fuse element is not smaller than 90% of a maximum consumption power of the fuse element calculated from current-voltage characteristics of the MOS type transistor.

4. A method of breaking down a fuse in a semiconductor device according to is claim 3 (13), wherein said setting a voltage at the connection point in said step (b) is in a state immediately before the fuse element is broken down.

5. A method of breaking down a fuse in a semiconductor device, comprising the steps of:
   (a) providing a semiconductor device having, on a substrate, a serial connection of a fuse element and a MOS type transistor, the fuse element being capable of being electrically broken down by flowing current therethrough, and the MOS type transistor having source, gate and drain terminals and a connection point between one end of the fuse element and one of the source and drain terminals; and
   (b) applying a voltage higher than a drain voltage of the MOS type transistor at which a drain current starts saturation, between the other end of the fuse element and the other of the source and drain terminals, a first voltage being applied to the other end of the fuse element, and a second voltage lower than the first voltage being applied to the other of the source and drain terminals, applying a predetermined program voltage to the gate terminal, and breaking down the fuse element by setting a voltage at the connection point between the fuse element and the MOS type transistor in a voltage range in which 80% to 98% of a saturation current of the MOS type transistor flows.

6. A method of breaking down a fuse in a semiconductor device according to claim 5 (14), wherein said setting a voltage at the connection point in said step (b) is in a state immediately before the fuse element is broken down.

* * * * *